United States Patent [19]
Gondotra et al.

[11] Patent Number: 5,088,639
[45] Date of Patent: Feb. 18, 1992

[54] SOLDERING PROCESS

[75] Inventors: Vinay Gondotra; Kiron P. Gore, both of Coral Springs; Steven T. Bogert, Plantation, all of Fla.

[73] Assignee: Motorola, Inc., Schaumburg, Ill.

[21] Appl. No.: 645,760

[22] Filed: Jan. 25, 1991

[51] Int. Cl.$^5$ .............................................. B23K 31/02
[52] U.S. Cl. ............................ 228/180.1; 228/180.2; 228/246
[58] Field of Search ................... 228/56.5, 180.1, 180.2, 228/246, 242

[56] References Cited

U.S. PATENT DOCUMENTS

| | | | |
|---|---|---|---|
| 3,958,740 | 5/1976 | Dixon | 228/180.2 X |
| 4,421,266 | 12/1983 | Bock | 228/180.2 |
| 4,462,534 | 7/1984 | Bitaillou | 228/180.1 |
| 4,558,812 | 12/1985 | Bailey | 228/180.2 X |
| 4,918,277 | 4/1990 | Zimmer | 228/180.2 X |

Primary Examiner—Richard K. Seidel
Assistant Examiner—Patty E. Hong
Attorney, Agent, or Firm—Daniel K. Nichols

[57] ABSTRACT

A soldering process uses a plurality of individual heating elements (204) to solder a plurality of solder locations. The process consists of the steps of substantially simultaneously picking up a plurality of solder preforms (202); placing the plurality of solder preforms substantially simultaneously on different interconnection locations (214) found on a circuit board (212); and substantially simultaneously soldering the plurality of solder preforms (202) with a heating element fixture (200) which has a plurality of individual heating elements (204) which match the different interconnection locations (214) found on the circuit board (212).

8 Claims, 4 Drawing Sheets

SOLDERING PROCESS

CROSS REFERENCED APPLICATIONS

This application is related to an application entitled "Method And Apparatus For Interconnecting And Shielding Two Assembled Circuit Boards" by inventors Andrezj T. Guzik, Giovanni Jaramillo, John P. Vajanyi Jr. Filed on even date herewith. Both applications are under common assignment to Motorola, Inc.

TECHNICAL FIELD

This invention relates generally to soldering processes, and more specifically to a multipoint soldering process utilizing solder preforms.

BACKGROUND

Automated point to point ("PTP") soldering processes are normally required in electronic manufacturing when assembled circuit boards can not withstand the temperatures associated with solder reflow, or when solder paste can not be screen printed on a circuit board due to space constraints. The problems associated with conventional PTP soldering processes are many and include: slow cycle times caused by their sequential nature (one solder joint at a time); solder quantities can not be accurately controlled; large amounts of space are required around the solder joints in order to allow for the soldering tool to reach the component, etc. One specific example of a typical type of PTP soldering process is a process which utilizes a robot mounted solder paste syringe which dispenses fixed volumes of solder. This type of PTP process has several of the problems discussed above plus the added problem of requiring hot gas reflow, or laser reflow both of which suffer from many reliability problems. A need exists for a soldering process which can provide accurate amounts of solder volumes and improved soldering cycle times for use in situations where solder reflow techniques can not be utilized.

SUMMARY OF THE INVENTION

Briefly, according to the invention, a process for simultaneously soldering a plurality of preselected located interconnections is disclosed. The soldering process comprises the steps of: picking up simultaneously a plurality of solder preforms; placing the solder preforms simultaneously on the randomly located interconnections; and soldering simultaneously the plurality of solder preforms with the use of a fixture having a plurality of individual heating elements. In one aspect of the invention, the solder preforms are substantially spherical pieces of solder.

DETAILED DESCRIPTION OF THE PREFERRED EMBODIMENT

Figure 1:
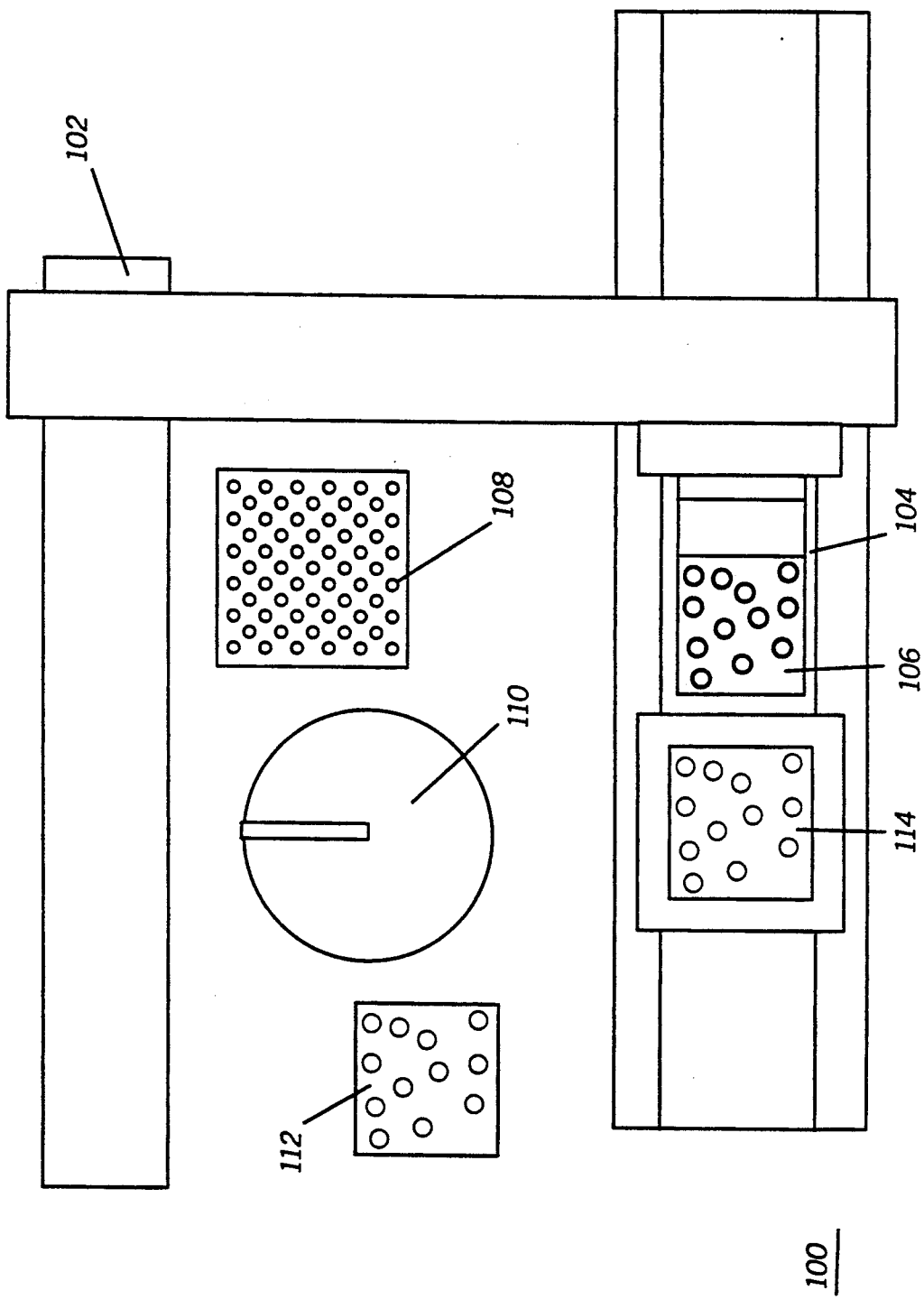
FIG. 1 is a top plane view of a soldering station in accordance with the present invention.

Referring now by characters of reference to the drawings, and first to FIG. 1, a top plane view of a soldering station 100 in accordance with the present invention is shown. Soldering station 100 comprises robot 102 which is used to manipulate the different tool fixtures required in the soldering process. Part of robot 102 is gripper 104 which is the part of the robot 102 which manipulates the different tool fixtures that are used during the soldering process. The soldering station 100 includes reservoir 108 which holds the solder preforms which are used in the soldering process. Preferably the reservoir 108 is an oscillating reservoir 108 which allows the solder preforms which are preferably solder balls, to be constantly moving inside of the reservoir 108. By oscillating reservoir 108, it becomes easier to grab the solder balls since the balls are discouraged from sticking to each other. Other methods of moving reservoir 108 can also be used such as shaking, or vibrating. Vacuum pickup tool 106 which is shown attached to the robot gripper 104, is used to substantially simultaneously pickup a plurality of solder balls from reservoir 108. The vacuum pickup tool 106 comprises a plurality of individual pickup elements which conform to the locations of the interconnections on circuit board assembly 114 which require soldering. After the solder balls are picked up, preferably a vision system, as is known in the art, can be used to verify that each of the individual pickup elements has a solder ball, thereby minimizing production problems. Another alternative that can be used to verify the presence of the solder ball would be to use some type of detection mechanism on the ends each of the individual pickup elements.

The pickup tool 106 is then moved to fluxing station 110 which is filled with solder flux in order to flux the solder balls prior to placing them onto circuit board 114. The solder balls are preferably dipped into flux station 110. The fluxing of the solder balls helps improve the soldering of the interconnection locations, and also acts as a "sticking" agent which holds the balls in place on circuit board 114 prior to the balls being soldered. After fluxing the plurality of solder balls, they are then substantially simultaneously placed on circuit board 114, by the vacuum pickup tool 106, which deposits the solder balls in the appropriate interconnection locations by releasing the vacuum which held the solder balls. Once the preceding steps are accomplished, robot 102 changes the vacuum pickup tool 106, and connects a heating element fixture tool 112 onto robot gripper 104. Heating element fixture 112 has a plurality of heating elements which conform to the different interconnections locations on circuit board 114. The plurality of individual heating elements simultaneously solder the plurality of solder balls which had been previously placed on top of board 114 by vacuum pickup tool 106. By substantially simultaneously soldering all of the interconnection locations a remarkable increase in cycle time reduction is achieved if compared to conventional point to point ("PTP") soldering techniques.

Figure 2A:
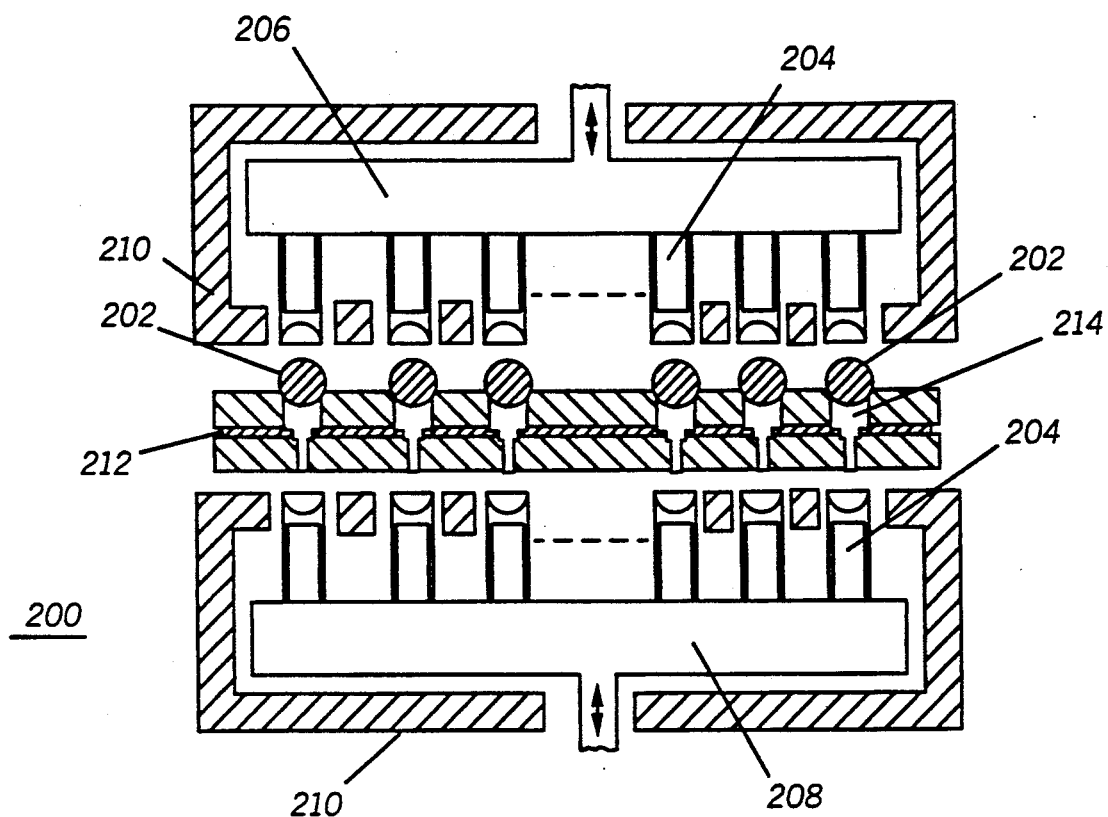
FIG. 2A is a side view of a heating element fixture in accordance with the present invention.

FIG. 2A is a side view of a heating element fixture 200 in accordance with the present invention. The heating element fixture 200 consists of a plurality of individual heating elements 204 which are used to heat solder balls 202. Each heating element 204 can have its own individual heating element in order to generate heat, or heat can be conducted from the top 206 and bottom 208 heating sections to each heating element 204 via heat conduction. The choice will normally depend on the size of the board being soldered, since reliable heat conduction will require that the distance between the individual heating elements 204 and the bottom and top heating sections (206 and 208) be close in distance. For most applications, the conduction of heat from heating element sections 206 and 208 will suffice since the majority of electronic circuit boards tend to be small in total surface area. Top and bottom heating element sections 206 and 208 can generate heat by any of a number of known methods known in the art (i.e. use of electrical heating coils, making the sections from resistive heating materials such as tungsten, etc.). The solder balls 202 are located on interconnection locations 214 which are located on circuit board 212. The size of the interconnection locations 214 which require soldering will determine if heating element fixture 200 will require both a top 206 and bottom 208 heating sections. If the interconnection locations 214 (e.g. feedthrough vias) are large (to much surface area for heat to conduct efficiently), heating the via 214 from both the top and bottom allows the solder ball 202 to uniformly melt inside of the individual interconnection locations 214. One skilled in the art will realize that if the interconnection locations are small enough, only a top heating section 206 would be required. Finally, an insulating sleeve 210 can also be part of the heating element fixture 200 in order to conserve the heat which is generated by the individual heating elements 204. The sleeve 210 can be made from any of the insulating materials which are commonly used for such proposes, such as fiberglass, etc. During normal operation robot gripper 104 will grab the heating element fixture 200 and compress the heating element sections (206 and 208) together against circuit board assembly 212, thereby subjecting the solder balls 202 to the heat generated by each of the individual heating elements 204.

Figure 2B:
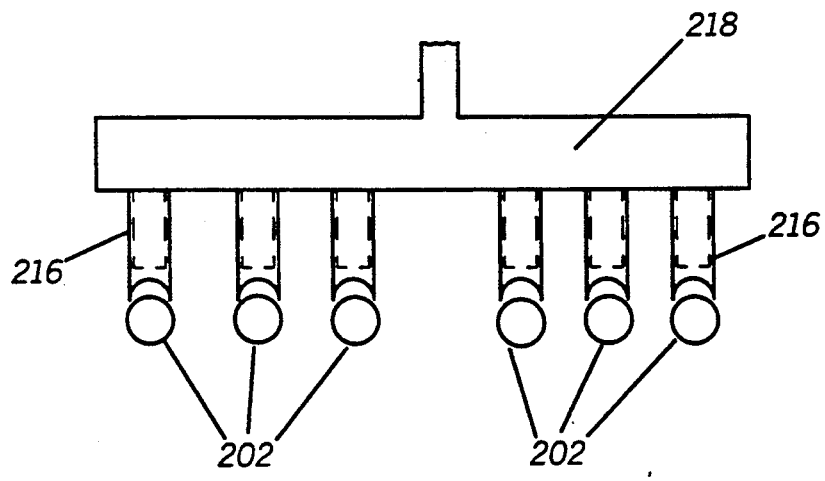
FIG. 2B is a side view of a vacuum pickup tool in accordance with the present invention.

In FIG. 2B a side view of a vacuum pickup tool 218 (similar to vacuum pickup tool 106) in accordance with the present invention is shown. Pickup tool 218 consists of a plurality of individual pickup elements 216 which conform in location to the preselected interconnection locations found on the circuit board which require soldering (i.e. the locations where the solder balls 202 will be required to be placed). Preferably, each of the pickup elements 204 have cupped shaped ends in order to help the individual pickup elements conform to the shape of the solder balls 202.

Figure 3A:
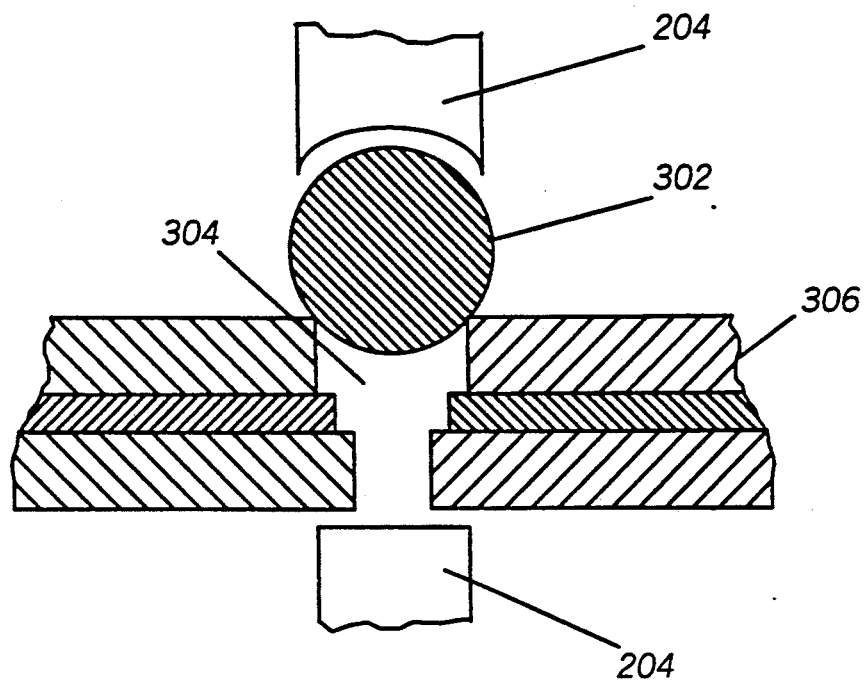
FIG. 3A is a partial view of a circuit board showing a single heating element soldering an interconnection location in accordance with the present invention.

FIG. 3A is a partial view of a circuit board assembly 306, showing an individual heating element 204 being pressed up against solder ball 302. The heating element 204 is being applied to both the top and bottom of interconnection location 304, which consists of a plurality of conductive feedthrough interconnection vias stacked one on top of the other. Since the interconnection location 304 is too large (e.g. circuit boards having many layers) for one heating element 204 alone to melt the solder uniformly inside the interconnection location 304, heating elements are applied to both the top and bottom of the interconnection location 304. Since in this case the circuit board assembly 306 is comprised of several circuit boards in registration one on top of the other, once the interconnection location 304 is soldered, the boards which make up circuit board assembly 306 become electrically interconnected to each other.

Figure 3B:
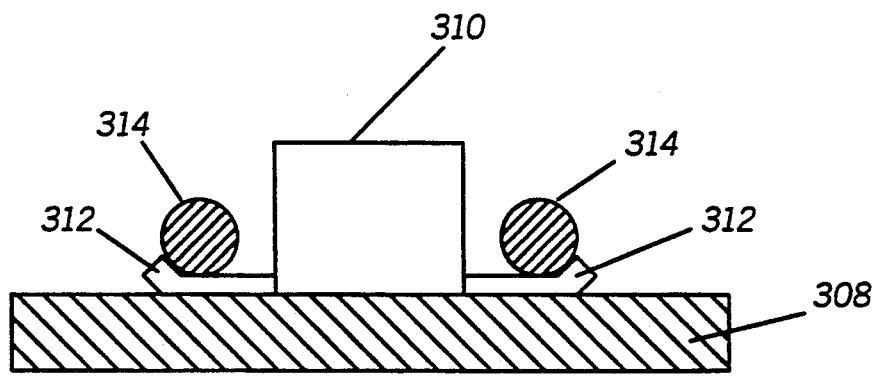
FIG. 3B is side view of an electronic component which can utilize the present invention.

In FIG. 3B a side view of an electronic component 310 which can utilize the present invention is shown. By making the component leads 312 slightly bent at the ends, solder balls 314 can be held in place while the heating elements are used to melt solder balls 314 which in turn electrically interconnects component 310 to circuit board 308. By fluxing solder balls 314 prior to placing them on the electronic component leads 312, the solder balls 314 will have a tendency to stick and hold the balls 314 further in place. As can be seen, the present invention can not only be used to solder interconnection locations such as vias, but also electronic components which are found on circuit boards.

Figure 4:
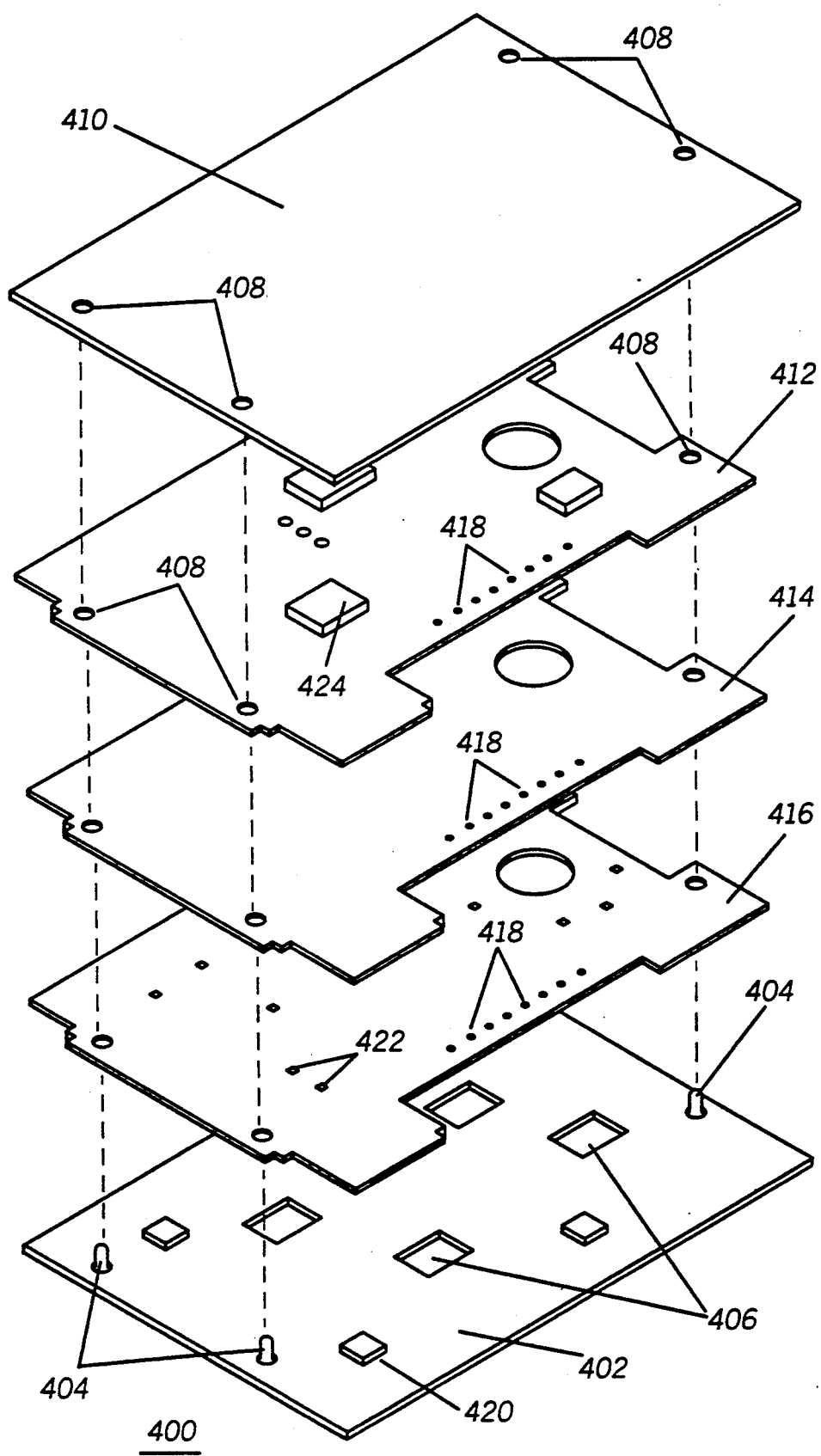
FIG. 4 is a exploded view of a circuit board assembly being placed in an assembly fixture in order to prepare the assembly for soldering.

In FIG. 4 an exploded view of a circuit board assembly 400 being placed in a circuit board fixture is shown. Circuit board assembly 400 is typical of the circuit boards which the soldering process in the present invention can be used for. The method of interconnecting the circuit board assembly can be carried out by a method as described in "Method And Apparatus For Interconnecting And Shielding Two Assembled Circuit Boards", and inventors Andrzej T. Guzik, Giovanni Jaramillo, and John P. Vajanyi Jr., which is under common assignment to Motorola, Inc., and which is hereby incorporated by reference. The circuit board fixture is comprised of fixture base 402, and fixture top 410. Base 402 consists of reliefs 406 and rubber stops 420, which help board 416, which has components on one side (not shown), lie flat against base 402. Also shown on board 416 are test points 422, which can be used to test board 416 prior to it being used in assembly 400. Second and third boards, 414 and 412 respectively, are then stacked on top of board 416. Board 414 in this particular case acts as a ground plane protecting boards 412 and 416, both of which carry electronic components 424. Since electronic components 424 can emit noise and electrical magnetic interference (EMI), ground plane board 414 can minimize the problems associated with these noise emissions.

Each board (412, 414, and 416) has a set of alignment apertures 408 which help register (properly align) the three boards. The alignment apertures 408 align with tooling pins 404, which are found on fixture base 402, and help register all three boards with each other. Each of the boards (412, 414, and 416) have conductive feedthrough interconnection vias 418 which are located in different preselected locations on each board. The vias 418 on each board are in register with each other, and allow the three boards to become electrically interconnected once these interconnection vias 418, are soldered. Since board 414 has pressure sensitive adhesive applied to both of its major surfaces, the three boards become attached to each other once the three boards are pressed together. This is accomplished by covering the three boards with fixture top 410 and placing the fixture in a mechanical press in order to activate the pressure sensitive adhesive which bonds the three boards (412, 414, and 416) together. Finally, the finished assembly 400 is removed from the fixture (412 and 410) and sent to soldering station 100 which electrically interconnects the three boards by placing solder balls on top of board 412 (on interconnection vias 418), and thereafter solders the locations thereby electrically interconnecting boards (412, 414, and 416).

In summary, the steps involved in the preferred soldering process are: picking up simultaneously a plurality of solder preforms from an oscillating container; verifying that all of the plurality of solder preforms have been picked up; fluxing the solder preforms; placing the solder preforms simultaneously on interconnection locations found in a circuit board; and soldering the plurality of solder preforms using a heating fixture having a plurality of individual heating elements which match the different interconnection locations found on the circuit board. By utilizing the above claimed invention, the soldering cycle time can be increased dramatically over known point to point (PTP) soldering techniques. By using conventional spherical solder preforms (solder balls), a consistent amount of solder can be used for all the solder joints. One skilled in the art will realize that different diameter solder balls can be used for different solder interconnection locations which require different amounts of solder. The present invention will be useful in those situations conventional solder reflow methods can not be used, and where PTP techniques prove to slow. By picking, placing, and soldering simultaneously a plurality of solder preforms using individual heating elements a tremendous cycle time increase can be achieved over PTP processes. The present invention will also protect circuit board assemblies which have components on both sides of the circuit board from being subjected to reflow temperatures which can prematurely damage components due to thermal shock.

What is claimed is:

1. A soldering process, comprising the steps of:
    substantially simultaneously picking up a plurality of solder preforms using a multi-point vacuum pickup tool having a pattern of cupped shaped heads that match the pattern formed by the different preselected interconnection locations found on a circuit board;
    substantially simultaneously placing the plurality of solder preforms on different preselected interconnection locations found on the circuit board; and
    substantially simultaneously soldering the plurality of solder preforms with a heating element fixture.

2. A soldering process as defined in claim 1, further comprising the step of:
    substantially simultaneously fluxing the plurality of solder preforms.

3. A soldering process as defined in claim 1, wherein the solder preforms are substantially spherical pieces of solder.

4. A soldering process as defined in claim 3, further comprising the step of:
    checking to make sure that the plurality of substantially spherical pieces of solder have been picked up.

5. A soldering process as defined in claim 3, wherein the circuit board is formed from a plurality of circuit boards each having a plurality of conductive feedthrough interconnection vias, said plurality of circuit boards being stacked on top of each other and in registration, with the conductive feedthrough interconnection vias on each circuit board being in substantial alignment with the conductive feedthrough interconnection vias of the other circuit boards.

6. A soldering process as defined in claim 5, wherein the soldering of the solder preforms causes the conductive feedthrough interconnection vias which are in substantial alignment with each other to become electrically interconnected.

7. A soldering process, comprising the steps of: substantially simultaneously picking up a plurality of substantially spherical solder preforms from an oscillating container filled with solder preforms using a multi-point vacuum pickup tool having a pattern of cupped shaped heads that match the pattern formed by the different preselected interconnection locations found on a circuit board;
    checking to make sure that all of the plurality of substantially spherical solder preforms have been picked up;
    fluxing the plurality of solder preforms;
    substantially simultaneously placing the plurality of substantially spherical solder preforms on different preselected interconnection locations found on the circuit board; and
    substantially simultaneously soldering the plurality of substantially spherical solder preforms with a heating element fixture which has a plurality of individual heating elements which match the different preselected interconnection locations found on the circuit board.

8. The soldering process of claim 7, wherein the circuit board includes top and bottom portions and the heating element further comprises top and bottom sections which help provide heat to both the top and bottom portions of the circuit board.

* * * * *